HIGH FREQUENCY ATTENUATOR CIRCUIT

Filed Aug. 11, 1954 4 Sheets-Sheet 1

INVENTORS
PETER D. LACY
DANIEL E. WHEELER
BY
Flehr and Swain
ATTORNEYS

March 8, 1960 P. D. LACY ET AL 2,928,058
HIGH FREQUENCY ATTENUATOR CIRCUIT
Filed Aug. 11, 1954 4 Sheets-Sheet 2

INVENTORS
PETER D. LACY
DANIEL E. WHEELER
BY [signature]
ATTORNEYS

INVENTORS
PETER D. LACY
DANIEL E. WHEELER
BY
Flehr & Swain
ATTORNEYS

March 8, 1960 P. D. LACY ET AL 2,928,058

HIGH FREQUENCY ATTENUATOR CIRCUIT

Filed Aug. 11, 1954 4 Sheets-Sheet 4

INVENTORS.
PETER D. LACY
DANIEL E. WHEELER
BY
Flehr and Swain
ATTORNEYS 2,928,058

HIGH FREQUENCY ATTENUATOR CIRCUIT

Peter D. Lacy, Redwood City, and Daniel E. Wheeler, Santa Cruz, Calif., assignors to Hewlett-Packard Company, Palo Alto, Calif., a corporation of California Application August 11, 1954, Serial No. 449,226

6 Claims. (Cl. 333—81)

The present invention relates generally to high frequency systems of the type making use of a helical transmission line, and to attenuating means for such system.

Helical transmission lines are lines which are electrically long, but physically short. Although they are often used in antenna systems as radiators and collectors, their greatest utility is for travelling wave tubes where they provide a means for producing an electromagnetic wave having a longitudinal field which travels slowly in the axial direction. An electromagnetic wave from a waveguide or coaxial system is coupled to the helix at the input end. For example, the means for coupling from the coaxial or waveguide system to the helix may be a helix directional type coupler of the type described in copending application Serial No. 403,172, filed January 11, 1954. The electromagnetic waves travel along the wire at approximately the speed of light, but the electromagnetic field travels at a velocity which is dependent upon the pitch of the helix. An electron beam, adapted to interact with the electromagnetic wave travelling along the helix, is directed along the axis of the helix. The output signal is removed by a second coupler which may be a helical coupler of the type referred to above.

One of the problems which arises in the operation of travelling wave tubes and amplifiers is that, as a consequence of their high gain, regeneration may occur as a result of the reflections arising from discontinuities. It is known that a resistive coating, or the like, may be placed within the central portion of the tube, usually on the inside surface of the glass, to attenuate the reflected wave. With the reflected energy so attenuated the energy reaching the input of the travelling wave tube is small and regeneration is impossible. Generally such attenuators are in the form of a coating or film of lossy material on the travelling wave tube envelope, disposed to embrace the helix in the region where attenuation is desired. It is necessary under certain conditions for this film to be within the envelope, where it intercepts a large percentage of the field surrounding the helix. Once the material is placed within the envelope of the tube, and the envelope sealed, it is impossible to adjust the amount of attenuation.

Attenuators which have been used with helical transmission lines, apart from a travelling wave tube, have been made in the form of a tube or collar of lossy ceramic material which embraces the helix. Such attenuators function in substantially the same manner as a coating or film upon the inner surface of a travelling wave tube envelope.

Attenuators of the type described above have been subject to certain disadvantages and difficulties. The amount of attenuation provided is fixed for a given construction, and it is difficult to obtain a predetermined amount of attenuation during manufacture. In many instances it is desirable to provide attenuating means which can be adjusted in accordance with requirements. Another difficulty is that an attenuator having a long length is required to give substantial attenuation. A further difficulty has been that the attenuators have not had broad frequency band characteristics, and therefore, their use has been confined to travelling wave tube systems designed for operation over a narrow frequency band. There are many possible applications of systems using travelling wave tubes which require broad band operation, or, in other words, which require operation at any desired frequency over a broad frequency range.

Aside from the problem of attenuation, travelling wave tube assemblies such as have been used in the past have been subject to undesired resonant frequencies. This is because the space within the metal shielding employed provides a cavity resonator which may be resonant at frequencies within the band of amplification. Where the amplification is within a narrow frequency band the effect of the cavity may not be noticeable. However when it is attempted to operate such equipment capable of amplification over a wide frequency band, the effect of such cavity resonance materially interferes with the desired performance.

In general it is an object of the present invention to provide improved attenuator means for use with helical transmission lines.

Another object of the invention is to provide improved attenuator means for use with tubes of the travelling wave type.

Another object of the invention is to provide attenuating means of the above character which is capable of high attenuation over a relatively short coupling length.

Another object of the invention is to provide attenuating means for use with helical transmission lines which will provide broad frequency band characteristics.

Another object of the invention is to provide attenuating means of the above character which can be placed external to the envelope of a travelling wave tube, and which can be readily removed for replacement or adjustment.

Another object of the invention is to provide a travelling wave tube housing which permits assembly of the associated parts without special tools, and which may be economically manufactured.

Other advantages and objects of this invention will be apparent from the particular description thereof made in connection with the following drawings.

Referring to the drawings.

Coupling of high frequency energy between helices is inherently directional with energy being transferred from one helix to the other by a cumulative process. Assume that the energy is travelling along a first helix which is coupled to a second helix, initially a small amount of the energy travelling along the first helix is transferred onto the second helix. As the energy travels down the length of the first helix more energy is transferred onto the second helix. If the second helix is sufficiently long and has the same velocity of propagation as the first helix, all the energy travelling along the first helix is transferred onto the second. This optimum condition of complete energy transfer will exist at one or more frequencies for a given coupler. At other frequencies the energy will either be incompletely transferred onto the second helix or will completely transfer onto the second helix and begin to transfer back onto the first helix. Consequently, only at particular frequencies is there complete energy transfer from one helix onto another helix. This, in effect, permits the transfer of substantial energy from one helix to another over a band of frequencies only.

In the above example, we assumed that the axial velocities of propagation of the two helices were equal, each in the absence of the other. Equal axial velocities of propagation may be obtained structurally by having the ratio of pitch (spacing from turn to turn in the axial direction) to turn circumference of the two helices, approximately equal. If the inner helix has a certain pitch and circumference, the other helix will have a greater pitch since it necessarily has a greater circumference. More simply, equal axial lengths of both helices should consist of the same length of wires. When the two helices do not have the same axial velocity of propagation, the incremental energy coupled from one helix to the other does not add in phase and it is not possible to obtain complete energy transfer.

Another factor which influences the amount of coupling is the proximity of the two helices. The closer the helices, the more coupling in a given length.

To obtain maximum coupling the helices should be wound in opposite directions. This is because energy travelling along one helix induces energy travelling in an opposite direction along the other helix. If the helices are wound in an opposite direction the incremental energies induced in the second helix will add substantially in phase. If the helices are wound in the same direction, the incremental energies will not add in phase and complete energy transfer cannot be achieved. In the helical attenuators which will be presently described we prefer to wind the helices in opposite directions to obtain maximum coupling. This type of winding is herein referred to as "cross-wound."

Figure 1:
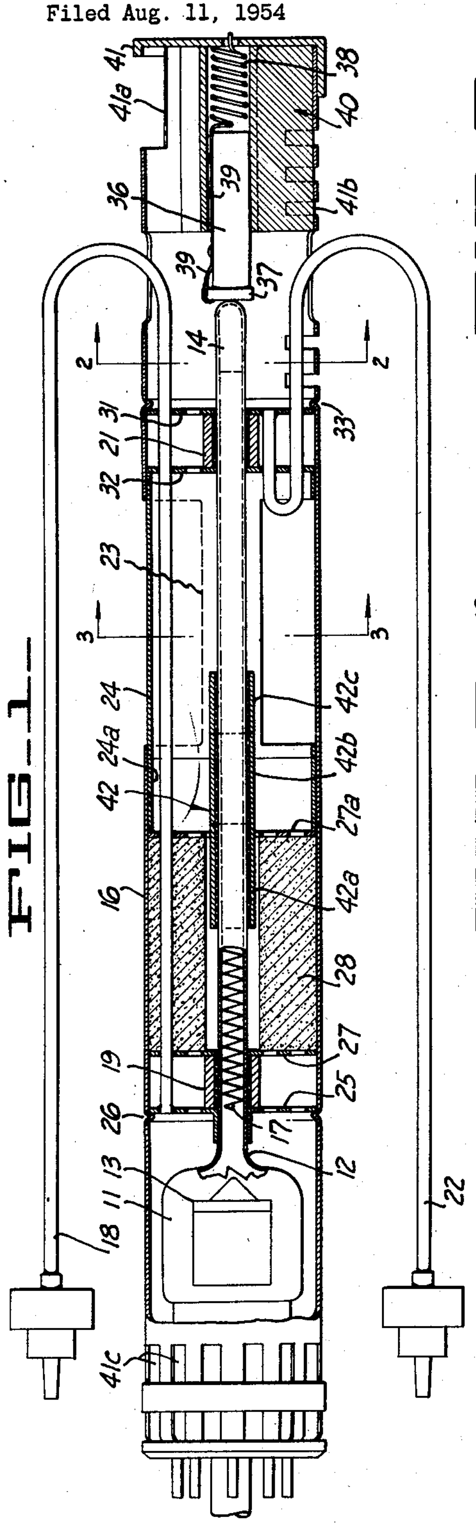
Figure 1 shows a travelling wave tube assembly and housing.
Figure 2:
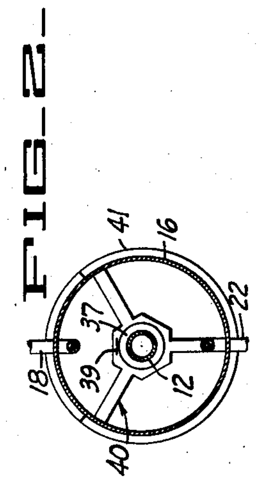
Figure 2 is a sectional view taken along the lines 2—2 of Figure 1.

In Figure 1 we have shown a particular construction of a travelling wave tube assembly. It includes a travelling wave tube 11 having a glass envelope 12, which surrounds the electron gun 13, the collector 14, and the helix 17. The helix forms a high frequency transmission line of the travelling wave type. Coaxial line 18 is adapted to receive the signal to be amplified and supply the same to the input end of the helix. The signal is coupled onto the helix by means of a helix directional coupler 19 of the type described in said co-pending application. A second helix directional coupler 21 couples the energy at the output end of the helix and directs it along the output line 22.

Figure 3:
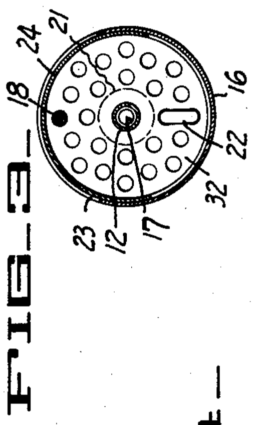
Figure 3 is a sectional view taken along the line 3—3 of Figure 1.

The travelling wave tube is placed within the tubular metal housing 16. This housing 16 has a window 23 to permit adjustment of the component parts. The closure 24 serves to seat the component parts of the assembly, as will be presently described, and is rotated to close the opening 23 after adjustments of the components has been made. A spacer 25 (Figures 1 and 3) seats against the shoulder 26 and holds the adjacent portions of the travelling wave tube coaxial to the housing. This spacer also supports the directional coupler 19. It can be formed as a perforated metal annulus having a central opening to receive the tube. A second similar spacer 27 serves to provide an abutment for the annular body 28. The body 28 is formed of suitable lossy material and serves to prevent resonance within the coaxial cavity formed by the helix 17 and the housing 16 and the couplers' terminating resistors (not shown). This attenuator or suppressor may be made, for example, by embedding carbon or metallic particles in a suitable dielectric. A spacer 27*a* is placed in contact with the other end of the annular body 28. Similar spacers 31 and 32 are adapted to hold the collector end of the travelling wave tube and the coupler 21. The closure 24 holds the components in place by urging the cylindrical spacer 24*a* against the spacer 27*a* and by urging spacer 32 toward the shoulder 33.

The member 36 formed of dielectric material has the metallic end portion 37 in contact with the collector 14. A continuous circuit results between the collector and the external circuit along the spring 38 which is connected to a spring metallic strip 39 soldered to the end portion 37. When the collector 14 becomes overheated, the solder melts and the spring strip 39 breaks contact with the end portion 37. The high voltages supply is cut out by means of a helix over current relay. By selecting the proper composition of solder, this action may be made to take place at a specified temperature. The member 40, includes fins which provide airducts to direct the flow of cooling air, as will be presently described, is made of dielectric impregnated with a suitable lossy material. The fins attenuate energy travelling along the housing 16 by acting as attenuators within the circular waveguide formed by the housing 16. The fins 40 have a central portion which accommodates the dielectric 36 and spring 38. The spring 38 urges the dielectric forward placing the portion 37 in contact with the collector 14. The bore of the fin 40 attenuates radio frequency energy transferred along the spring 38.

The fins 40 are attached to the cap 41. Adjacent the cap the housing is provided with a side opening 41*a* adapted to communicate with the housing of a blower or fan, whereby during operation of the travelling wave tube a stream of cooling air is continuously delivered into the housing through the opening 41*a*. The air flows past the fins, a portion of the air flowing along the housing and discharging through openings 41*c* and a portion discharging through the ports 41*b*.

In the intermediate portion of the helix 17, we provide high frequency attenuating means 42 of a novel construction, to prevent regeneration. As will be presently explained, the attenuating means may be designed to attenuate over a selected frequency band or over a relatively wide frequency band, depending upon the application of the tube.

Figure 4:
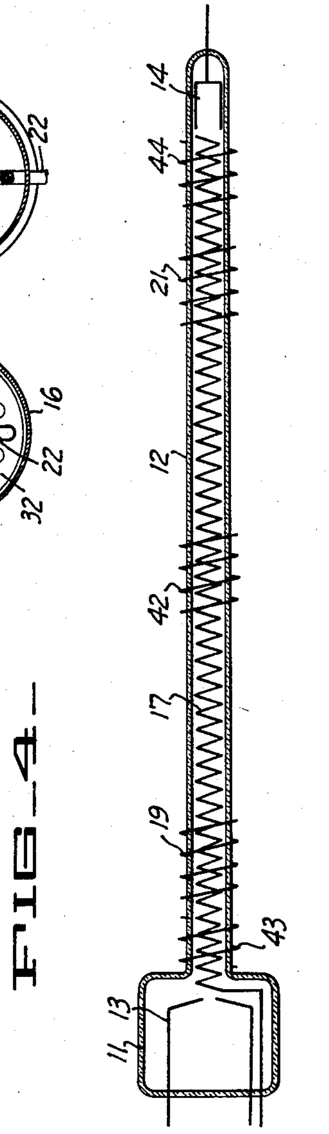
Figure 4 is a schematic diagram of a travelling wave tube with input and output couplers and attenuators.

In Figure 4 we have shown a schematic view of the travelling wave tube of Figure 1. As before, the travelling wave tube consists of the electron gun 13 and collector 14 enclosed within the glass envelope 12. The input and output couplers 19 and 21 surround the transmission line 17. Attenuator 42 of a type to be presently described is located in the region between the output and input couplers. Additional attenuators 43 and 44 may be placed at the two ends of the tube to absorb energy reaching the ends and reduce reflections.

In Figures 5 through 10 we have shown various ways in which attenuators can be constructed. The simple embodiment of Figure 5A consists of an elongated resistive conductor 46 wound with spaced convolutions in the form of an open ended helix. We prefer to embed the helix in low loss dielectric material 47 whereby the conductor is rigidly held to a desired form. However, the attenuators may be used without being embedded. We prefer to wind the helix with nickle chromium resistance material, but any type of high resistance wire may be employed.

An attenuator constructed as described above utilizes transfer of energy from the helix to the attenuator by the principle of coupled helices, as described above. The energy travelling along the attenuator's resistive material is dissipated in the form of heat.

For a given axial length of helix the amount of attenuation per unit length over a given band of frequencies may be controlled by varying the resistance of the resistance material (i.e. coefficient of resistance or cross section), by varying the pitch of the windings and by adjusting the coupling. These variables are adjusted experimentally to obtain the desired attenuation. It has been found experimentally that there is an optimum condition, that is, a condition where maximum attenuation is reached for a wire having a given diameter and a given amount of resistance per unit length.

Figure 5A:
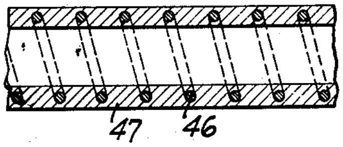
Figure 5A is a sectional view of helical attenuator having a helix wound with a single wire.
Figure 5B:
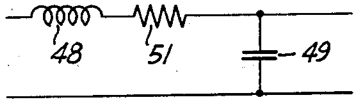
Figure 5B is an equivalent lumped constant circuit section of the apparatus shown in Figure 5A.

In Figure 5B we have shown an equivalent circuit for the attenuator of Figure 5A. Inductor 48 and capacitor 49 represent the equivalent lumped constant circuit for the helical transmission line. Series resistor 51 represents the loss added by the high resistance helical conductor.

Figure 6A:
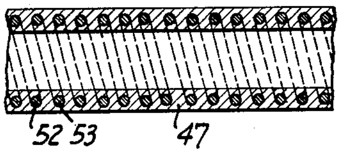
Figure 6A is a sectional view of a helical attenuator of the double helix type.

At higher frequencies it is necessary to introduce a greater loss per unit length. In Figure 6A we have shown an attenuator which accomplishes this in a novel manner. The attenuator is wound with two elongated resistive conductors 52 and 53. As before these open ended helices are wound to provide the desired attenuation. The pitch, resistivity and spacing being obtained experimentally to achieve the results desired. The helices are coaxial, have adjacent parallel convolutions, and are embedded in a dielectric sleeve or collar as shown. In this manner the attenuator may be made relatively short and yet give the desired attenuation.

Figure 6B:
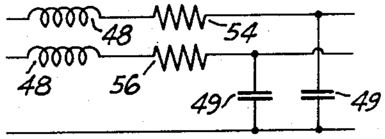
Figure 6B is an equivalent lumped constant circuit section of the apparatus shown in Figure 6A.

The equivalent circuit for the attenuator of Figure 6A is shown in Figure 6B. Inductors 48 and capacitors 49 represent the helical transmission line. Resistors 54 and 56 represent the resistance of the elongated resistive conductors and are shown in shunt. It is seen from the equivalent circuit that I have introduced greater loss per unit length in this manner.

Figure 7A:
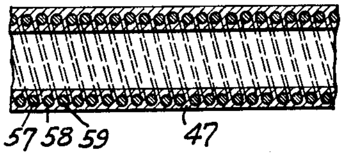
Figure 7A is a sectional view of an attenuator of the triple helix type.

In Figure 7A we have shown an attenuator which gives greater attenuation at the higher frequencies. Three helices are formed of elongated resistive material and are wound to provide the desired attenuation. The pitch and spacing necessary to attain this attenuation are determined experimentally. They are represented in Figure 7A as resistive conductors 57, 58 and 59 embedded in the dielectric sleeve 47.

Figure 7B:
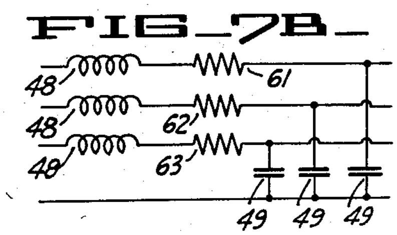
Figure 7B is an equivalent lumped constant circuit section of the apparatus shown in Figure 7A.

In Figure 7B we have shown an equivalent circuit for the attenuator of Figure 7A. Inductor 48 and capacitor 49 represent the helical transmission line while the resistors 61, 62 and 63 represent the elongated resistive material. As is apparent from the equivalent circuit diagram, we have introduced still greater attenuation per unit length.

Figures 8A, 9:
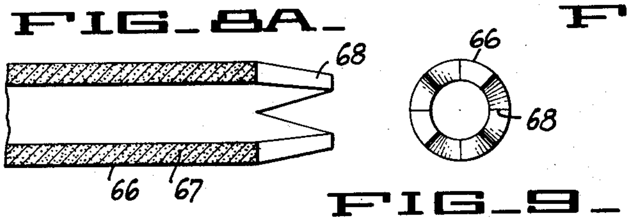
Figure 8A is a sectional view of an attenuator consisting of a dielectric sheath impregnated with lossy material.
Figure 9 is an end view of the apparatus of Figure 8A.

In Figure 8A we have shown an attenuator 66 which may be used to attenuate low frequencies. This attenuator is formed of a sleeve or collar 67 which is composed of dielectric material impregnated with a lossy material. We prefer to use Teflon as the dielectric material and to impregnate the Teflon with carbon particles. This attenuator is very effective at the low frequencies where a large amount of coupling exists. The end 68 of the attenuator is formed in a prong-like fashion to prevent reflections. Figure 9 is an end view of the attenuator of Figure 8A.

Figure 8B:
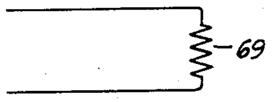
Figure 8B is an equivalent lumped constant circuit section of the apparatus shown in Figure 8A.

In Figure 8B we have shown an equivalent circuit of the attenuator of Figure 8A. The resistor 69 represents the loss introduced by the lossy sleeve or collar. This type of loss is shunt loss.

Figure 10A:
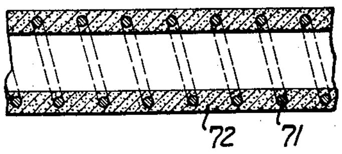
Figure 10A is a sectional view of a helical attenuator having a helix wound with a single wire and including distributed loss in the dielectric collar.

In Figure 10A we have shown an attenuator which combines the features of the helical attenuator which introduces series loss, with those of the loss collar attenuator, which introduces shunt loss. The helix may be of the single conductor type or one of the multi-conductor type previously described. The dielectric material in which the helices are embedded is impregnated with lossy material, or the lossy material may be coated on the surface of the wire prior to embedding it in the dielectric. In Figure 10A, the elongated resistive material is shown at 71, 72 represents the collar made of lossy material and in which the helix is embedded. This type of attenuator combines the shunt and series loss and therefore provides more attenuation over the same or a relatively broader band. It has been found that it may also be employed to give more attenuation over a narrower band.

Figure 10B:
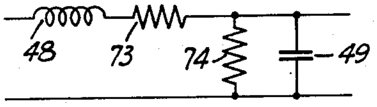
Figure 10B is an equivalent lumped constant circuit section of the apparatus shown in Figure 10A.

In Figure 10B we have shown an equivalent circuit for the attenuator of Figure 10A. Inductor 48 and capacitor 49 again represent the helical transmission line. Resistor 73 represents the series loss introduced by the elongated resistive material, while resistor 74 represents the shunt loss added by the carbon particles dispersed in the dielectric collar.

It is possible to obtain increased attenuation at a given frequency by cascading a series of attenuators having the proper length and frequency characteristics. It is also possible to cover a wide range of frequencies by cascading attenuators having different frequency characteristics. Each attenuator can be arranged to reach a peak attenuation at a different frequency and thus the total attenuation will be the sum of the attenuation of each alone.

Figure 13:
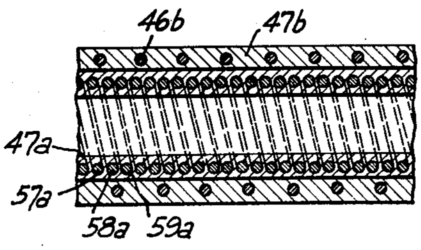
Figure 13 is a sectional view of concentric helices of the type shown in Figure 5A.

Rather than cascading attenuators, it is preferable to telescope attenuators as shown for example in Figure 13. The inner attenuator is generally wound with a plurality of helices to couple the high frequency energy and the outer attenuator is coupled to the inner helix and adapted to attenuate the lower frequency energy. The attenuator shown in Figure 13 has an inner attenuator of the type shown in Figure 7A and an outer attenuator of the type shown in Figure 5A. The inner attenuator has three helices **57*a*, 58*a*, and 59*a*, formed of resistive material and embedded in dielectric sleeve 47*a*. The outer attenuator has helix 46*b* embedded in dielectric 47*b*** and has its axis coincident with that of the inner helix. The inner helices are preferably cross-wound with respect to the helical transmission line with which they are associated and the outer helix is cross-wound with respect to the inner helix. The pitch of the helices and the coupling between the helices is experimentally adjusted to give the desired attenuation vs. frequency characteristics. In this manner it is possible to achieve high attenuation per inch. Although we have described a particular combination, it is obvious that any desired attenuation vs.

frequency characteristic may be obtained by changing the number of helices in the inner and outer attenuators.

An attenuator was constructed which had nine helices in the inner attenuator and a single helix in the outer attenuator. The attenuation vs. frequency characteristics showed that the attenuation was effective over a broad band of frequencies.

Figure 14:
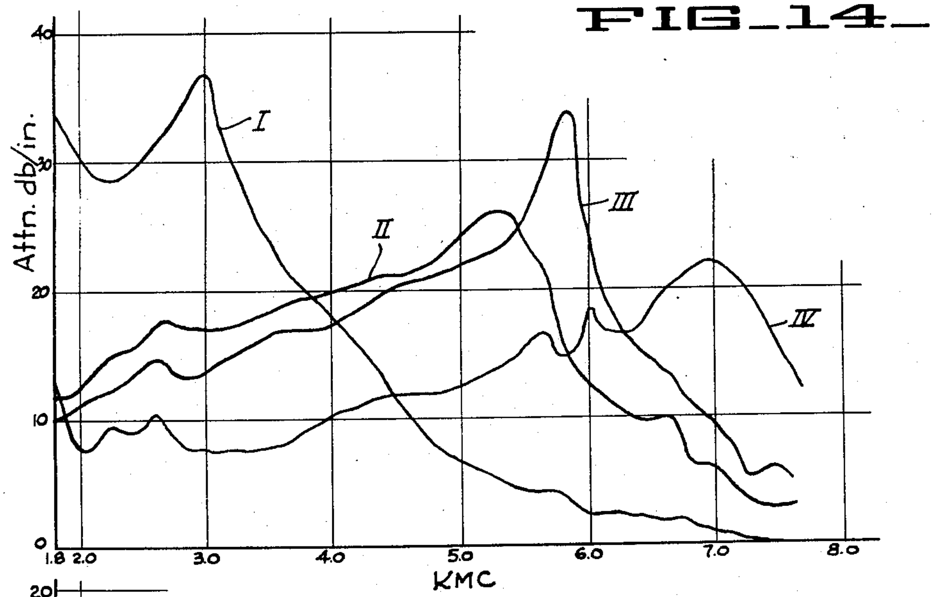
Figure 14 shows a plot of attenuation in db per inch as a function of frequency in kilomegacycles for attenuators constructed as shown in Figures 5, 6 and 7.

An attenuator was constructed as shown in Figure 5. The helix was 0.204 inch in diameter and wound with nickel chrome resistance wire, 0.0006 inch in diameter embedded in a Teflon tube. The Teflon tube had an inside diameter of 0.200 inch and an outside diameter of 0.250 inch. The helix which was cross-wound had 20 turns per inch. In Figure 14, curve I shows a plot of attenuation in db per inch as a function of frequency for an attenuator constructed as described above.

An attenuator was constructed as shown in Figure 6A by winding two helices 0.204 inch in diameter having 18 turns per inch with 0.0006 inch diameter nickel chrome resistance wire. The two helices were placed coaxially and with adjacent parallel convolutions embedded in the Teflon tube. The Teflon tube had an inside diameter of 0.200 inch and an outside diameter of 0.250 inch. The resistance wire was cross-wound and had 20 turns per inch. In Figure 14, curve II is a plot of attenuation in db per inch as a function of frequency for an attenuator constructed as shown above.

An attenuator was constructed as shown in 7A by winding three helices 0.204 inch in diameter having 20 turns per inch contradirectional with 0.006 inch diameter nickel chrome resistance wire. The helices were embedded in Teflon in such a manner that they had adjacent parallel convolutions. The Teflon tube had an inside diameter of 0.200 inch and an outside diameter of 0.250 inch. In Figure 13, curve III shows a plot of attenuation in db per inch as function of frequency.

Curve IV shown in Figure 14 is for an attenuator (not shown) made with 7 helices embedded in Teflon. The Teflon tube and wires were the same as previously described, but the pitch differed in that there were only 18 turns per inch.

Referring to Figure 14, it is seen that the maximum attenuation occurs at higher frequencies as more helices are added in a unit length of material. It is also possible to place three such sections end to end to form a broad band attenuator having a characteristic curve which is the summation of the individual curves.

Figure 15:
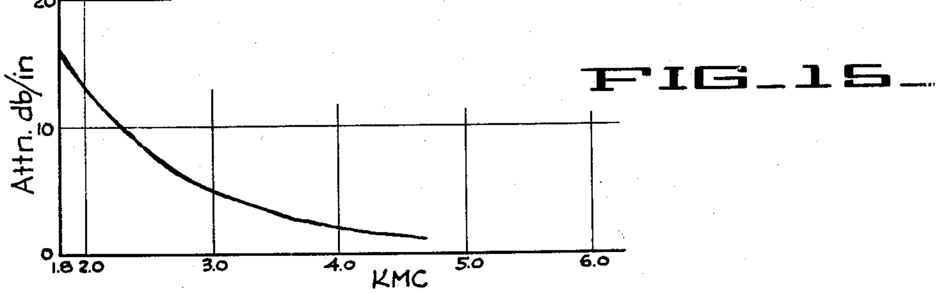
Figure 15 shows a plot of attenuation in db per inch as a function of frequency in kilomegacycles for an attenuator constructed as shown in Figures 8 and 9.

In Figure 15 we have shown a curve of attenuation in db per inch as a function of frequency for an attenuator constructed in Figure 8A. The attenuator was constructed by forming a one inch Teflon tube impregnated with carbon particles. The inside diameter of the Teflon tube was 0.200 inch and the outside diameter was 0.250 inch. Four prongs 68 were included 1 inch long and which extended a distance of half the length back from one end.

Elongated resistive material wound in the form of a helix and interrupted at one or more points along its length provides a series of attenuators. If these cuts are so located that the portions of resistive conductors are equal in length, it will be found that attenuation will be observed at particular frequencies. This attenuation at particular frequencies occurs when the helices have a length near one-half the wavelength of the frequency of operation. The attenuation results from a combination of the cumulative reflection from the end of these helices and the increased ohmic loss produced by the reflected waves. For frequencies below this frequency, a series capacity is introduced between the adjacent helices which alters the velocity of composite system. It is therefore necessary to correct the pitch to overcome this defect. The correct axial velocity of propagation should be determined experimentally.

An important advantage of this type of attenuator is that it may be made to cover a specific frequency band with little or no effect at other frequencies. Consequently, particular frequencies may be attenuated in a travelling wave tube without affecting the gain of the tube at other frequencies.

Figure 11A:
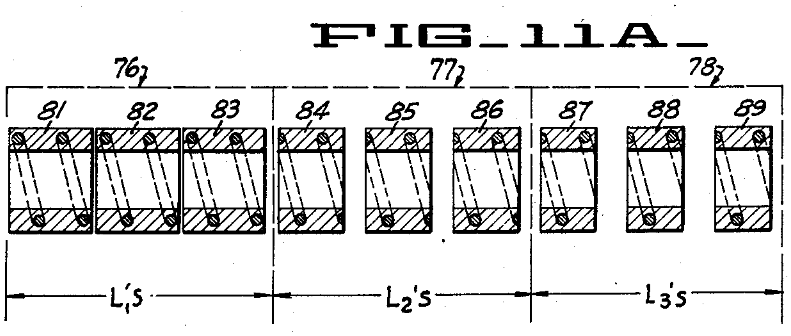
Figure 11A shows a sectional view of a periodically loaded helical type attenuator.

In Figure 11A we have shown a composite attenuator of the type last described. Block 76 represents low frequency attenuator means, 77 represents mid-frequency attenuator means, and 78 represents high frequency attenuator means. The low frequency attenuator means shown is composed of three helices 81, 82 and 83, of the type previously described, having two turns each of resistive wire. The mid-frequency attenuator 77 is composed of three helices 84, 85 and 86 having one and one-half turns each of resistive wire. The high frequency attenuator 78 is composed of three helices 87, 88 and 89 having one and one-quarter turns each of resistive wire. These helices are formed as previously described by interrupting a continuous helix. It is to be understood that this particular embodiment is for purposes of illustration only and that the number of turns per helix should be adjusted to obtain attenuation at a desired frequency. An attenuator of this type may be referred to as a periodically loaded helix type attenuator. It should be understood that although we have described a method wherein the helix is interrupted to give a periodically loaded line, other well known means for obtaining periodic loading may be employed.

Figure 11B:
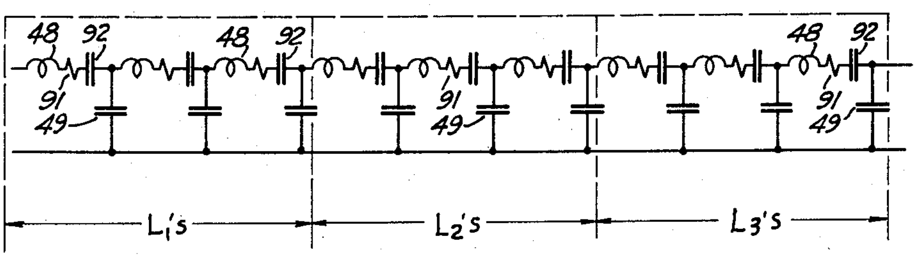
Figure 11B is an equivalent lumped constant circuit section of the apparatus shown in Figure 11A.

In Figure 11B we have shown the equivalent lumped constant circuit for the composite attenuator of Figure 11A. The equivalent lumped inductance of the helical transmission line is shown as 48 and the lumped capacitance is shown as 49. Resistors 91 represent the resistance of the elongated resistive conductors while the capacitors 92 represent the effective series capacity introduced below the half wavelength frequency.

The helices referred to above may also be constructed by placing sections of helical attenuators of the type previously described axially adjacent, each section having the proper pitch and the proper number of turns. The series capacity introduced between adjacent ends by this method is difficult to control. It is preferred to interrupt a continuous helix.

Coupled helix attenuators allow arbitrary loss of a function of frequency to be obtained. However, in some cases it is desirable to precede such an attenuator with an attenuator of the low frequency type illustrated in Figures 8A and 9. The prongs in this case extend toward the incoming signal which is attenuated. The low frequency attenuator is employed to attenuate reflection from the helix attenuator.

Figure 16:
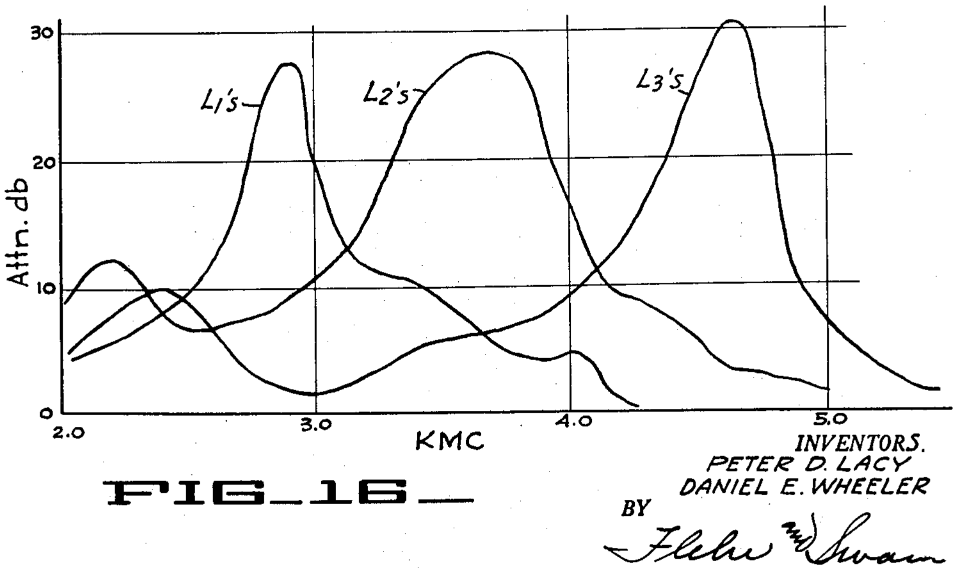
Figure 16 shows a plot of attenuation in db as a function of frequency in kilomegacycles for the periodically loaded attenuators of Figure 11.

Attenuators were constructed as shown in Figure 11A, blocks 76, 77 and 78. Nickel chrome resistance wire (309 Ω/ft.) was wound in the form of a cross-wound helix 0.204 inch in diameter and having 20 turns per inch. The helix which was ½ inch long was embedded in a dielectric, was interrupted forming helices having two turns each and forming a continuous interrupted helix. The attenuator was tested and the $L_1$'s in Figure 16 is a plot of attenuation in db as a function of frequency.

A second attenuator was constructed winding nickel chrome resistance wire having a resistance of 856 Ω/ft., in a cross-wound helix 0.204 inch in diameter and having 26 turns per inch. The helix was 1 inch long, was embedded in dielectric and interrupted so as to form helices having one and one-half turns each. The helix constructed in this manner was tested and curve $L_2$'s, Figure 16 shows a plot of attenuation in db as a function of frequency.

A third attenuator was constructed as shown in block 78. A helix 0.204 inch in diameter was wound contradirectional of nickel chrome resistance wire having a resistance of 86 Ω/ft. and 32 turns per inch and was embedded in dielectric. The helix was interrupted so as to form helices having one and one-quarter turns each. A plot of attenuation db as a function of frequency is shown as curve $L_3$'s in Figure 16.

An attenuator was then formed by placing the three attenuators described above axially adjacent as shown in Figure 11A. The resulting curve compared favorably with the addition of the curves shown. This showed that a broad band attenuator could be produced by combining periodically loaded attenuators.

Figure 12A:
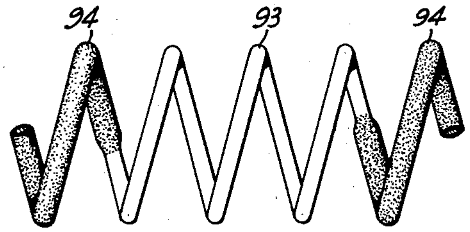
Figure 12A shows a loss-less helical type coupler terminated in a lossy section.
Figure 12B:
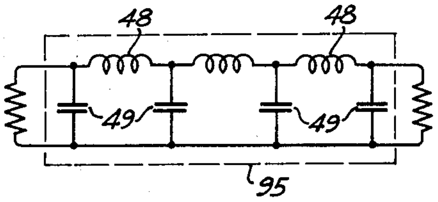
Figure 12B is an equivalent lumped constant circuit section of the apparatus shown in Figure 12A.

In Figure 12A we have shown another type of attenuator made by winding a loss-less coupled helix 93 and terminating it in lossy material 94. The equivalent circuit is shown at 12B where the inductance of the helical transmission line is represented by 48, the capacitance by 49 and the lossy material by 95. Improved results were obtained by winding a loss-less helix and then coupling attenuators of the type shown in Figures 5, 6 and 7 to the ends of the loss-less helix.

This loss-less type helix attenuator has high attenuation over a definite frequency range. The frequency range is determined by the length of the loss-less helix. As previously shown, the length of the coupler determines the band over which energy is substantially coupled and consequently the band of frequencies which is attenuated.

The attenuator shown as 42 in Figure 1 was composed of three attenuators of the type previously described. The first attenuator **42*a* was of the type described and shown in Figure 13. The attenuator 42*b* was of the type shown in Figure 7A, but composed of seven helices, and the attenuator 42*c* was of the type shown in Figure 8A. The tube shown in Figure 1 was operated over the frequency range 1.8 to 6 kilomegacycles. Operation was found to be satisfactory over the entire range without any serious oscillation occurring. This is, of course, an indication that all reflected components were attenuated by the helix type couplers and that all resonant modes within the cavity formed by the travelling wave tube helix and the housing were attenuated by the lossy attenuator 28**.

We have described each type of attenuator individually to facilitate the description. It is obvious that there are many combinations possible and that any attenuation vs. frequency characteristic may be obtained by properly combining the individual attenuator sections described.

We claim:

1. In high frequency apparatus adapted for continuous coupling to a helical transmission line, an attenuator comprising at least one elongated resistive conductor formed as a helix and adapted to be disposed with said line for coupling therewith, said helix having its axis parallel to that of said transmission line and its pitch adjusted to give a predetermined attenuation vs. frequency characteristic, and said elongated resistive conductor having a high resistance per unit length thereby providing a high dissipation per unit length of helix.

2. In high frequency apparatus adapted for the continuous coupling to a helical transmission line, an attenuator comprising at least one elongated resistive conductor formed as a helix and adapted to be disposed with said line for coupling therewith, said helix having its axis parallel to that of said transmission line and its pitch adjusted and its path periodically interrupted to give a predetermined attenuation vs. frequency characteristic, and where said elongated resistive conductor has a high resistance per unit length thereby providing high dissipation per unit length.

3. Apparatus as in claim 2 wherein each of said interruptions are spaced at approximately one-half wavelength at the desired operating frequency.

4. In high frequency apparatus adapted for continuous coupling to helical transmission line, an attenuator comprising at least one elongated resistive conductor formed as a helix and adapted to be disposed axially with said line for coupling therewith and lossy material serving to embed said helix, said helix having its axis parallel to that of said transmission line and its pitch adjusted to give a predetermined attenuation vs. frequency characteristic, said elongated resistive conductor having a high resistance per unit length thereby providing high dissipation per unit length.

5. In high frequency apparatus adapted for continuous coupling to a helical transmission line, an attenuator comprising at least one elongated resistive conductor formed as a helix and adapted to be disposed with said line for coupling therewith, said helix being cross wound with respect to said helical transmission line and having its axis parallel to that of said transmission line and its pitch adjusted whereby equal axial lengths of both helices have substantially the same length of wire, and said elongated resistive conductor having a high resistance per unit length thereby providing a high dissipation per unit length of helix.

6. In high frequency apparatus adapted for continuous coupling to a helical transmission line, an attenuator comprising at least one elongated resistive conductor formed as a helix and adapted to be disposed coaxially with said line for coupling therewith, said helix being cross-wound with respect to the helical transmission line and having its axis parallel to that of said transmission line and its pitch adjusted whereby equal axial lengths of both helices have substantially the same length of wire, and said elongated resistive conductor having a high resistance per unit length thereby providing a high dissipation per unit length of helix.

References Cited in the file of this patent

UNITED STATES PATENTS

| | | |
|---|---|---|
| 2,588,832 | Hansell | Mar. 11, 1952 |
| 2,626,371 | Barnett | Jan. 30, 1953 |
| 2,650,350 | Heath | Aug. 25, 1953 |
| 2,661,441 | Mueller | Dec. 1, 1953 |
| 2,725,499 | Field | Nov. 29, 1955 |
| 2,811,673 | Kompfner | Oct. 29, 1957 |
| 2,829,300 | Wilson | Apr. 1, 1958 |

FOREIGN PATENTS

| | | |
|---|---|---|
| 856,469 | Germany | Nov. 20, 1952 |